(12) United States Patent
Arishima et al.

(10) Patent No.: US 8,796,609 B2
(45) Date of Patent: Aug. 5, 2014

(54) PHOTOELECTRIC CONVERSION APPARATUS AND IMAGING SYSTEM USING THE PHOTOELECTRIC CONVERSION APPARATUS

(71) Applicant: Canon Kabushiki Kaisha, Tokyo (JP)

(72) Inventors: Yu Arishima, Yokohama (JP); Yasuhiro Kawabata, Kawasaki (JP); Hideaki Takada, Yokohama (JP); Seiichirou Sakai, Ebina (JP); Toru Koizumi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/895,045

(22) Filed: May 15, 2013

(65) Prior Publication Data

US 2013/0248940 A1  Sep. 26, 2013

Related U.S. Application Data

(62) Division of application No. 12/885,683, filed on Sep. 20, 2010, now Pat. No. 8,466,401.

(30) Foreign Application Priority Data

Sep. 24, 2009 (JP) .................................. 2009-219218
Aug. 20, 2010 (JP) .................................. 2010-185289

(51) Int. Cl.
 *H01L 27/146* (2006.01)
(52) U.S. Cl.
 USPC ........................................ 250/208.1; 257/292
(58) Field of Classification Search
 USPC ........ 250/208.1; 348/302; 257/291–293, 435, 257/444
 See application file for complete search history.

(56) References Cited

U.S. PATENT DOCUMENTS

| | | | |
|---|---|---|---|
| 7,187,052 B2 | 3/2007 | Okita et al. | 257/444 |
| 7,283,305 B2 | 10/2007 | Okita et al. | 359/619 |
| 7,538,804 B2 | 5/2009 | Okita et al. | 348/241 |
| 7,557,846 B2 | 7/2009 | Ohkawa | 348/302 |
| 7,557,847 B2 | 7/2009 | Okita et al. | 348/308 |
| 7,629,568 B2 | 12/2009 | Koizumi et al. | 250/214 R |
| 2003/0085399 A1 | 5/2003 | Inagaki | 257/53 |
| 2003/0209712 A1 | 11/2003 | Fujita et al. | 257/72 |
| 2004/0119864 A1 | 6/2004 | Kikuchi | |
| 2005/0174552 A1 | 8/2005 | Takada et al. | 355/53 |
| 2005/0237405 A1 | 10/2005 | Ohkawa | 348/308 |
| 2005/0269604 A1 | 12/2005 | Koizumi et al. | 257/291 |

(Continued)

FOREIGN PATENT DOCUMENTS

| | | | |
|---|---|---|---|
| CN | 1691345 A | 11/2005 | |
| JP | 2003-069005 A | 3/2003 | |

(Continued)

*Primary Examiner* — Seung C Sohn
(74) *Attorney, Agent, or Firm* — Fitzpatrick, Cella, Harper & Scinto

(57) ABSTRACT

A photoelectric conversion apparatus of the present invention includes: a plurality of photoelectric conversion elements arranged on a substrate; a transistor for transferring a signal charge; and a plurality of transistors for reading out the signal charge transferred. The plurality of photoelectric conversion elements include a first photoelectric conversion element and a second photoelectric conversion element adjacent to each other. The photoelectric conversion apparatus of the present invention includes: a first semiconductor region having a first conductivity type arranged between the first photoelectric conversion element and the second photoelectric conversion element; and a second semiconductor region having the first conductivity type that is arranged on a region where the plurality of transistors are arranged and that has a width larger than that of the first semiconductor region of the first conductivity type.

9 Claims, 7 Drawing Sheets

(56) References Cited

U.S. PATENT DOCUMENTS

| | | |
|---|---|---|
| 2007/0090274 A1 | 4/2007 | Lee et al. |
| 2007/0114629 A1 | 5/2007 | Dosluoglu et al. ............. 257/435 |
| 2008/0062294 A1 | 3/2008 | Koizumi et al. .............. 348/300 |
| 2009/0218479 A1 | 9/2009 | Arishima et al. ............. 250/226 |
| 2009/0237543 A1 | 9/2009 | Hatano et al. ................. 348/308 |
| 2010/0025570 A1 | 2/2010 | Koizumi et al. ........... 250/208.1 |
| 2010/0060762 A1 | 3/2010 | Takada et al. ................. 348/300 |
| 2011/0068252 A1 | 3/2011 | Kawabata et al. ......... 250/208.1 |
| 2011/0134270 A1 | 6/2011 | Arishima et al. .......... 348/222.1 |

FOREIGN PATENT DOCUMENTS

| | | |
|---|---|---|
| JP | 2003-258232 A | 9/2003 |
| JP | 2004-186408 A | 7/2004 |
| JP | 2006-024907 A | 1/2006 |
| JP | 2007-019521 A | 1/2007 |
| JP | 2008-084962 A | 4/2008 |

PHOTOELECTRIC CONVERSION APPARATUS AND IMAGING SYSTEM USING THE PHOTOELECTRIC CONVERSION APPARATUS

CROSS REFERENCE TO RELATED APPLICATIONS

This application is a division of U.S. application Ser. No. 12/885,683, filed Sep. 20, 2010. The entire disclosure of this prior application is incorporated herein by reference.

BACKGROUND OF THE INVENTION

1. Field of the Invention

The present invention relates to a structure of isolation of a photoelectric conversion apparatus.

2. Description of the Related Art

CCD and CMOS photoelectric conversion apparatuses are used in a multiplicity of digital still cameras and digital camcorders. In recent years, pixels in the photoelectric conversion apparatuses are reduced, and consequently, countermeasures for the cross talk of charge to adjacent pixels are studied.

Japanese Patent Application Laid-Open No. 2003-258232 discloses a configuration in which a P well region serving as a barrier for isolation for preventing the cross talk of charge between adjacent pixels is formed at a deep region according to an N well region of a photoelectric conversion element.

SUMMARY OF THE INVENTION

The present invention provides a photoelectric conversion apparatus comprising: a substrate; a plurality of pixels, wherein each of pixels includes photoelectric conversion element arranged on the substrate; a transistor arranged on the substrate for transferring a signal charge generated in the photoelectric conversion element; and a plurality of transistors for reading out the signal charge transferred, wherein the plurality of pixels include first and second photoelectric conversion elements adjacent to each other, a first semiconductor region of a first conductivity type such that the electric charge generated in the photoelectric conversion element is a minority carrier is formed between the first and second photoelectric conversion elements, and a second semiconductor region having the first conductivity type and of a width larger than that of the first semiconductor region of the first conductivity type is arranged in a region in which the plurality of transistors for reading out the signal charge transferred are arranged.

Other features and advantages of the present invention will be apparent from the following description taken in conjunction with the accompanying drawings, in which like reference characters designate the same or similar parts throughout the figures thereof.

Further features of the present invention will become apparent from the following description of exemplary embodiments with reference to the attached drawings.

Figure 1:
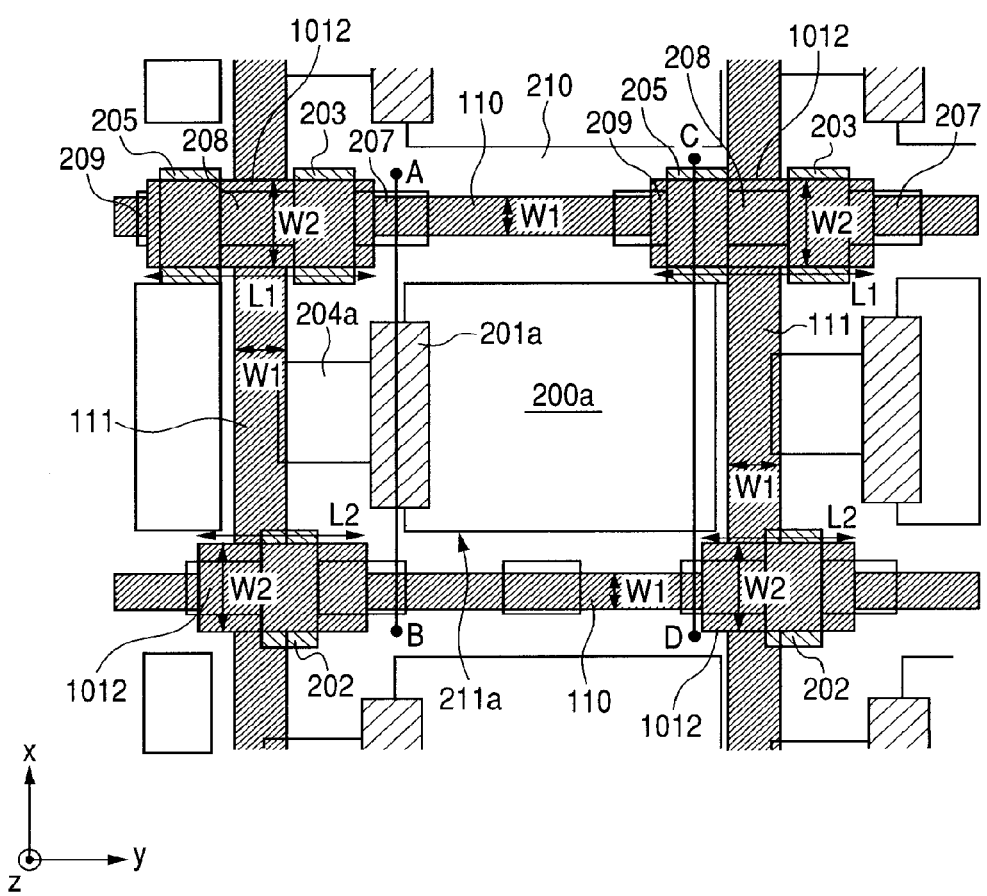
FIG. 1 is a plan view of a photoelectric conversion apparatus according to a first embodiment.

The accompanying drawings, which are incorporated in and constitute a part of the specification, illustrate embodiments of the invention and, together with the description, serve to explain the principles of the invention.

DESCRIPTION OF THE EMBODIMENTS

Preferred embodiments of the present invention will now be described in detail in accordance with the accompanying drawings.

The present inventors have found out that there may be a new problem along with reduction in pixels in the P well region disclosed in Japanese Patent Application Laid-Open No. 2003-258232. The problem is that when the pixels are reduced, a well region for isolation reduces a region of a photoelectric conversion element, and the sensitivity of the photoelectric conversion element may be reduced. For example, if the well region for isolation is a P semiconductor region serving as a barrier for signal charge, the P well isolation region replaces an N semiconductor region of the photoelectric conversion element.

If the width of the P well region for isolation is narrowed down, impurities may not be implanted at a desired depth in the ion implantation when the P well region is formed. Transistors for reading out the charge of the photoelectric conversion elements are provided around the photoelectric conversion elements, and the thresholds of the transistors may vary if the transistors are arranged on the P well region for isolation. If there are variations in the thresholds of the transistors, the dynamic range may be narrowed down, and the performance of the transistors may be reduced.

An object of the present invention is to provide a photoelectric conversion apparatus capable of preventing reduction in performance of transistors while maintaining the sensitivity of photoelectric conversion elements.

A photoelectric conversion apparatus of the present invention includes: a substrate; a plurality of photoelectric conversion elements arranged on the substrate; a transistor for transferring a signal charge generated in the photoelectric conversion element; and a plurality of transistors for reading out the transferred signal charge. The plurality of photoelectric conversion elements include a first photoelectric conversion element and a second photoelectric conversion element adjacent to each other. Provided are a first semiconductor region of a first conductivity type such that the electric charge generated in the photoelectric conversion element is a minority carrier is formed between the first and second photoelectric conversion elements, and a second semiconductor region of the first conductivity type arranged in a region in which the plurality of transistors for reading out the signal charge transferred are arranged. The width of the second semiconductor region is wider than the width of the first semiconductor region of the first conductivity type.

Such a configuration can prevent degrading performance of transistors while maintaining the sensitivity of photoelectric conversion elements.

Hereinafter, embodiments of the present invention will be described in detail with reference to the drawings.

(Example of Pixel Circuit)

Figure 2A:
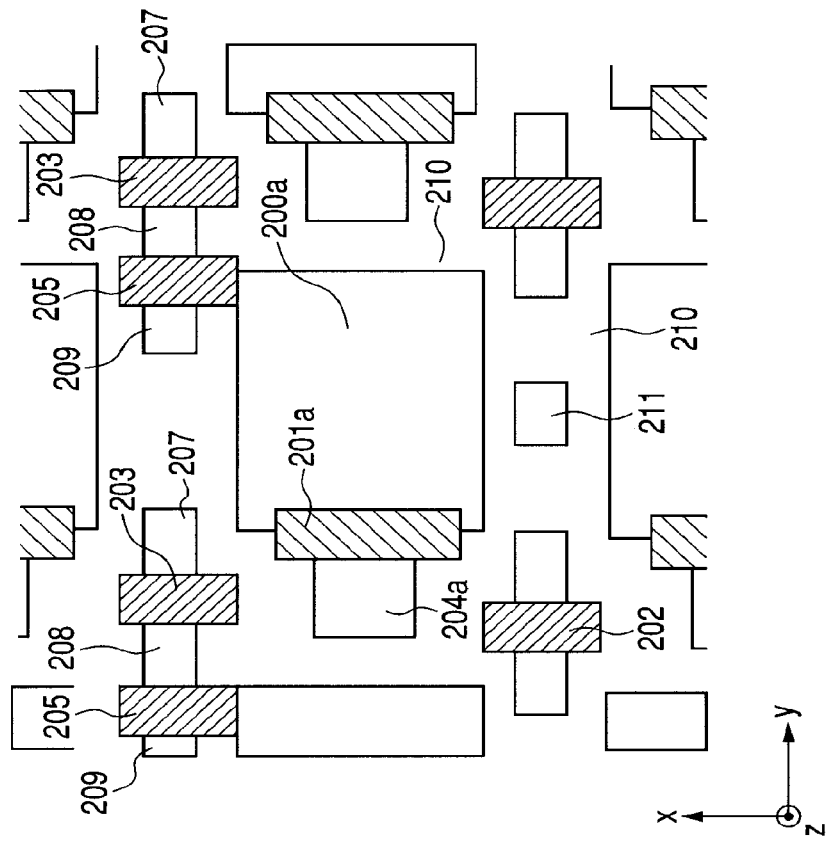
FIGS. 2A and 2B illustrate an example of a pixel circuit of the photoelectric conversion apparatus and are plan views of the pixel circuit.
Figure 2B:
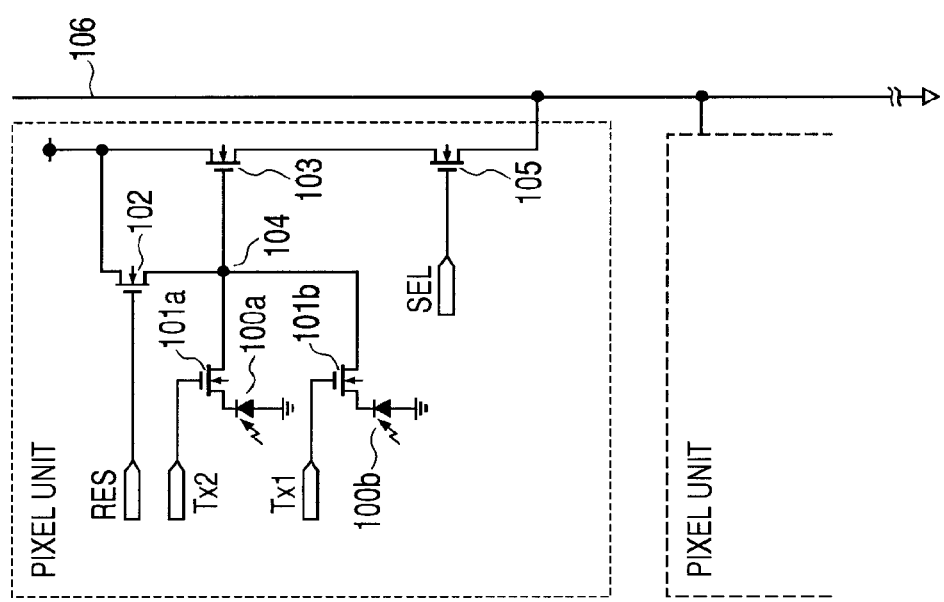

An example of a pixel circuit, to which the present invention can be applied, will be described. FIG. 2A is a circuit diagram illustrating an example of the pixel circuit, to which the present invention can be applied, and FIG. 2B is a plan view illustrating a plane layout of one pixel of the pixel circuit. Hereinafter, a case in which a signal charge is an electron will be described.

In FIG. 2A, the pixel unit includes at least two pixels. A pixel includes at least one photoelectric conversion element. In FIG. 2A, photodiodes 100 (100a and 100b) as photoelectric conversion elements and transfer MOS transistors 101 (101a and 101b) are included. A reset MOS transistor 102, an amplifying MOS transistor 103, and a selection MOS transistor 105 are also included. Therefore, two pixels, or two photodiodes, share the reset MOS transistor 102, the amplifying MOS transistor 103, and the selection MOS transistor 105. The transfer MOS transistors 101 transfer signal charges generated in the photoelectric conversion elements 100 to a floating diffusion region 104. The amplifying MOS transistor 103 performs output according to the potential of the floating diffusion region 104 to an output line 106 through the selection MOS transistor 105. The amplifying MOS transistor 103 is part of a source follower circuit, and the gate electrode is connected to the floating diffusion region 104. The reset MOS transistor 102 resets a node of the gate electrode of the amplifying MOS transistor 103, i.e. the floating diffusion region 104, to a prescribed potential (reset potential). A transfer control signal TX1 is supplied to the transfer MOS transistor 101b, and a transfer control signal TX2 is supplied to the transfer MOS transistor 101a. A reset control signal RES is supplied to the reset MOS transistor 102, and a selection control signal SEL is supplied to the selection MOS transistor 105. The control signals control reading of the signal charge. Such a pixel unit is one-dimensionally or two-dimensionally arranged in the photoelectric conversion apparatus to form an imaging region. The pixel unit may not include two pixels, and an arbitrary configuration can be applied.

FIG. 2B illustrates a plane layout of one pixel of the photoelectric conversion apparatus including the circuit of FIG. 2A. In FIG. 2B, a photoelectric conversion element 200 corresponding to 100(100a) of FIG. 2A is arranged. Reference numeral 201 denotes a gate electrode of the transfer MOS transistor 101(101a), and reference numeral 202 denotes a gate electrode of the reset MOS transistor 102. Reference numeral 203 denotes a gate electrode of the amplifying MOS transistor 103, reference numeral 205 denotes a gate electrode of the selection MOS transistor 105, and reference numeral 204a denotes a floating diffusion region. Reference numeral 207 denotes a drain region of the amplifying MOS transistor, and reference numeral 208 denotes a source region of the amplifying MOS transistor and a drain region of the selection MOS transistor. Reference numeral 209 denotes a source region of the selection MOS transistor, and the source region is connected to the output line 106 in FIG. 2A. Reference numeral 211 denotes a semiconductor region for supplying voltage to a semiconductor region and to a semiconductor substrate and is, for example, a well contact.

Reference numeral 210 denotes an isolation region that defines an active region of each element. Although a LOCOS (Local Oxidation of Silicon) structure is used for the isolation region 210 in the present embodiment, an STI (Shallow Trench Isolation) structure and other structures may be used. The isolation region 210 may also be configured to include only a semiconductor region serving as a barrier to the signal charge (diffusion isolation). When the isolation region 210 is configured to include only the semiconductor region serving as the barrier to the signal charge, the active region is defined at a boundary with the semiconductor region serving as the barrier to the signal charge. In FIG. 2B, one active region includes a photoelectric conversion element 200a and the floating diffusion region 204a, and other active regions include source regions and drain regions of the transistors. The pixels, i.e. the pixel unit, are arranged in a matrix along a first direction (X axis) and a second direction (Y axis), and the first direction and the second direction are orthogonal to each other. In FIG. 2B, the photodiode 100b of FIG. 2A corresponds to an adjacent photoelectric conversion element arranged along the first direction of the photoelectric conversion element 200a. In FIG. 2B, the photoelectric conversion element 200a serves as a first photoelectric conversion element, a photoelectric conversion element arranged along the first direction serves as a second photoelectric conversion element, and a photoelectric conversion element arranged along the second direction serves as a third photoelectric conversion element.

The photoelectric conversion apparatus is not limited to the circuit as shown in FIG. 2A. More photoelectric conversion elements may be configured to share the amplifying MOS transistor, or the selection MOS transistor may not be included. The photoelectric conversion apparatus is not limited to the plane layout as shown in FIG. 2B. When the signal charge is an electron, each MOS transistor would be NMOS transistor. When the signal charge is a hole, each MOS transistor would be PMOS transistor. And, it would be an ordinary design matter to change a polarity of a particular MOS transistor. Hereinafter, embodiments of the present invention will be described with reference to the drawings.

First Embodiment

The photoelectric conversion apparatus of the present embodiment will be described with reference to FIGS. 1, 3A and 3B. FIG. 1A is a plan view corresponding to the plan view of FIG. 2B.

In FIG. 1, regions where P semiconductor regions as barriers to signal charge (for example, electron) that can function as isolation are arranged over the plane layout of FIG. 2B for description. The P semiconductor regions are actually arranged inside the semiconductor substrate, and FIG. 1 illustrates a shape in which configurations are projected on the surface of the semiconductor substrate. The P semiconductor regions as barriers to signal charge (for example, electron) that can function as isolation include first semiconductor regions 110, third semiconductor regions 111, and second semiconductor regions 1012. Those P semiconductor regions are capable of functioning as an isolation for a photoelectric conversion element, and a well for a transistor. The first semiconductor regions 110 are arranged along the second direction and are arranged adjacent to the photoelectric conversion element 200a in the first direction. Therefore, the first semiconductor regions 110 are arranged between the first photoelectric conversion elements and the second photoelectric conversion elements. The third semiconductor regions 111 are arranged along the first direction and are arranged adjacent to the photoelectric conversion element 200a in the second direction. Therefore, the third semiconductor regions 111 are arranged between the first photoelectric conversion elements and the third photoelectric conversion elements. When the arrangement is projected on the surface of the semiconductor substrate, the first semiconductor regions 110 and the third semiconductor regions 111 are arranged in a lattice. The second semiconductor regions 1012 are arranged at a region where transistors for reading out the transferred signal charge are arranged, and the second semiconductor regions 1012 are arranged below gate electrodes of the transistors. In FIG. 1, the second semiconductor regions 1012 are arranged below channel sections, source regions and drain regions of the transistors. The first semiconductor regions 110 and the third semiconductor regions 111 have a width W1. According to the channel sections of the transistors, the second semiconductor regions 1012 have a width W2 wider than the channel sections and have a length L1 or a length L2 longer than the channel length of the channel sections. According to the configuration, the edges of the first or third semiconductor regions do not touch the channel sections of the transistors, and constant second semiconductor regions are arranged at the channel sections of the transistors. Therefore, the variations in the thresholds of the transistors can be reduced. In other words, the characteristics of the photoelectric conversion elements and the transistors can be maintained while preventing the signal charge from flowing into adjacent photoelectric conversion elements.

The width W2 of the second semiconductor regions 1012 is parallel to the channel width direction of the corresponding transistors and is parallel to the first direction in the present embodiment. The width W2 is wider than the channel width of the corresponding transistors. The second semiconductor regions 1012 have a length L1 and a length L2. The lengths L1 and L2 are parallel to the channel length direction of the corresponding transistors and are parallel to the second direction in the present embodiment. The lengths L1 and L2 are arbitrary and can be any length if the lengths are at least longer than the channel length of the corresponding transistors. The transistors for reading out the transferred signal charge are amplifying transistors, selection transistors and reset transistors in the present embodiment.

A cross-sectional schematic diagram of the photoelectric conversion apparatus corresponding to FIG. 1 will be described with reference to FIGS. 3A and 3B. FIG. 3A is a cross-sectional schematic diagram along an AB line of FIG. 1, and FIG. 3B is a cross-sectional schematic diagram along a CD line of FIG. 1. The same configurations as in FIG. 1 are designated with the same reference numerals in FIGS. 3A and 3B, and the description will not be repeated.

Figure 3A:
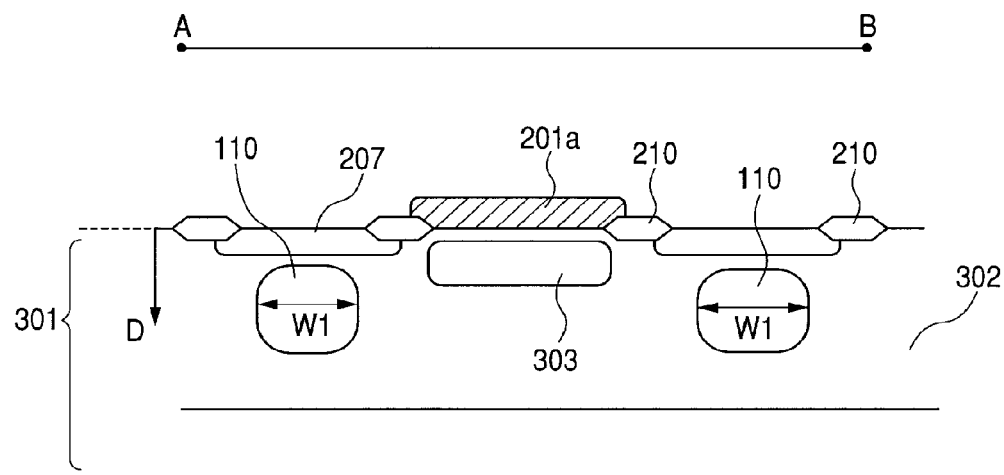
FIGS. 3A and 3B are cross-sectional schematic diagrams of the photoelectric conversion apparatus according to the first embodiment.
Figure 3B:
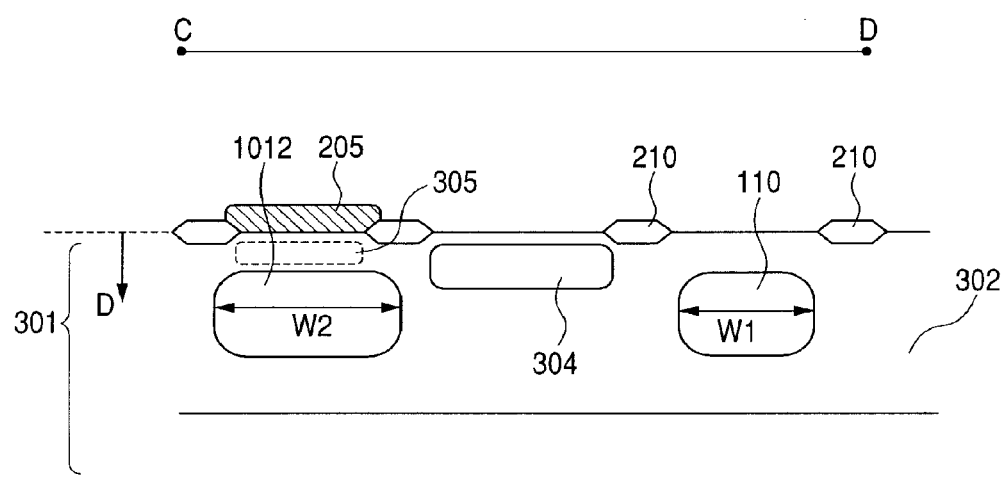

In FIGS. 3A and 3B, reference numeral 301 denotes an N semiconductor substrate, and reference numeral 302 denotes a P semiconductor region. The semiconductor substrate 301 has a configuration including an epitaxial layer on the semiconductor substrate. Reference numeral 303 denotes a channel section formed below a gate electrode 201a of the transfer transistor, and reference numeral 304 denotes an N semiconductor region as a charge accumulation region of the photoelectric conversion element 200a of FIG. 1. Reference numeral 305 denotes a channel section formed below the gate electrode 205 of the selection transistor. The channel section of the transistor denotes a region where a channel can be formed when the transistor is operating. An arrow D denotes a depth direction of the semiconductor substrate 301.

In FIGS. 3A and 3B, the first semiconductor region 110 has the width W1 and a length D1 in the depth direction, and the second semiconductor region 1012 has the width W2 and the length D1 in the depth direction. As shown in FIG. 3A, the first semiconductor region 110 is arranged below the drain region 207 in an AB line cross section passing through the source region or the drain region of the transistor. Meanwhile, as shown in FIG. 3B, the second semiconductor region 1012 is arranged below the gate electrode 205 of the selection transistor in a CD line cross section passing through the gate electrode 205 of the selection transistor. The width of the second semiconductor region 1012 is wider than the width of the channel section 305 formed below the gate electrode 205 of the selection transistor, and the second semiconductor region 1012 is arranged below the channel section 305. Such a configuration can reduce the variations in the thresholds of the transistors.

When ion is implanted to a position deeper than the channel section in the semiconductor substrate, the incidence angle of the implanted ion may vary due to the characteristics of the ion beam. Part of the ion that obliquely enters during the formation of a fine pattern passes through an opening edge of a photoresist with high aspect ratio, is reflected by a sidewall of the photoresist, or enters the semiconductor substrate with energy lost from predetermined injected energy. The ion with lost energy does not reach a desired depth.

If the P semiconductor region 1012 that can be arranged below the channel section is formed in a pattern thinner than the channel width, the ion does not reach the desired depth due to the foregoing reasons, and the P semiconductor region may be formed at the channel section. The slightly arranged P semiconductor region may increase the density of the P semiconductor region 302 and may increase the threshold of the N MOS transistor. For example, resetting of the floating diffusion region is difficult if the threshold of the reset MOS transistor rises. Furthermore, the dynamic range during signal output narrows down if the threshold of the amplifying MOS transistor increases. The implantation of the ion with lost energy can be prevented by making the semiconductor region 1012 arranged below the channel section wider than the channel section.

Based on a known semiconductor manufacturing technique, the photoelectric conversion apparatus of the present embodiment can be formed by ion implantation using, for example, a photoresist mask in which regions where the first to third semiconductor regions illustrated in FIG. 1 are arranged are opened. And, the first semiconductor region expect for a portion overlapping with the second semiconductor region, and the third semiconductor region may be formed using the same mask, while the second semiconductor region may be formed using the different mask.

Although the first semiconductor region 110 and the third semiconductor region 111 have the same width W1 to make the cross talk of signal charge to adjacent pixels constant in the present embodiment, the widths may be different depending on the arrangement of the elements. Making the leakage of the signal charge to surrounding pixels constant can facilitate a correction process of an image signal. The width of the third semiconductor region 111 can be set such that an increase in the parasitic capacitance of the adjacent floating diffusion region 204 is prevented.

The second semiconductor regions can be arranged at intersections between the first semiconductor regions and the third semiconductor regions arranged in a lattice. More specifically, the transistors for reading out the transferred signal charge can be arranged at intersections between the first semiconductor regions and the third semiconductor regions arranged in a lattice. Such an arrangement can improve the symmetry of arrangement between the photoelectric conversion elements and other elements. Such an arrangement can also reduce variations in the leakage of the signal charge to surrounding pixels.

The foregoing configuration can provide a photoelectric conversion apparatus capable of preventing reduction in performance of the transistors while maintaining the sensitivity of the photoelectric conversion elements.

Second Embodiment

Figure 4:
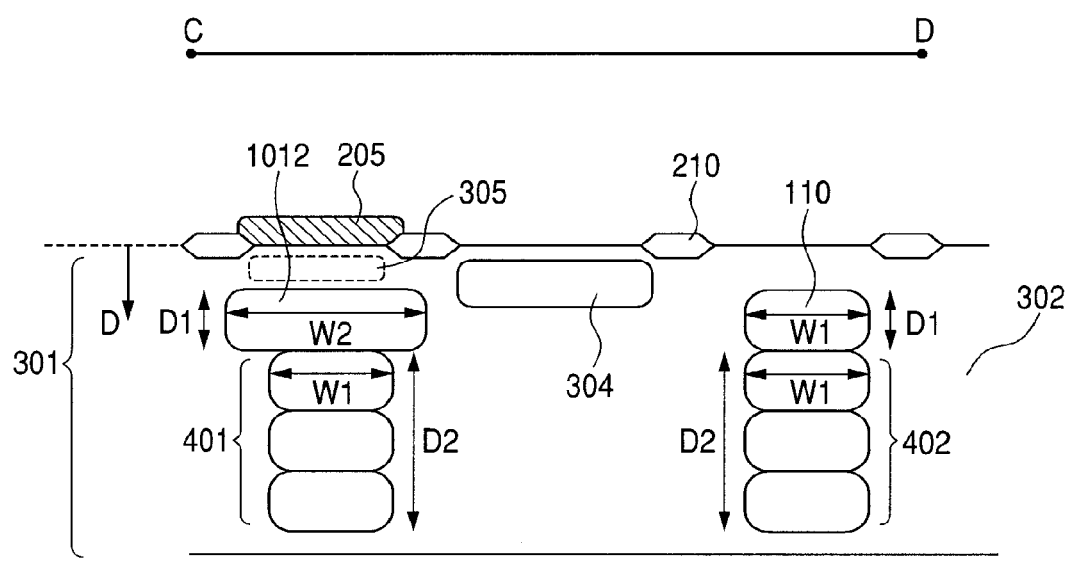
FIG. 4 is a cross-sectional schematic diagram of the photoelectric conversion diagram according to a second embodiment.

The photoelectric conversion apparatus of the present embodiment will be described with reference to FIG. 4. FIG.

4 is a cross-sectional schematic diagram corresponding to FIG. 3B. The same configurations as in FIG. 3B are designated with the same reference numerals, and the description will not be repeated.

Compared to the first embodiment, the photoelectric conversion apparatus of the present embodiment is characterized by including a plurality of semiconductor regions that can function as isolation. More specifically, in FIG. 4, a plurality of fourth semiconductor regions 401 are arranged below the second semiconductor region 1012, the fourth semiconductor regions 401 having the width W1 that is narrower than the width W2 and that is the same as the width of the first semiconductor region. A plurality of fifth semiconductor regions 402 with the width W1 are arranged below the first semiconductor region 110. The performance of the transistors can also be maintained with such a configuration, because the second semiconductor region 1012 is arranged to cover the channel sections of the transistors.

Since the fourth semiconductor regions 401 and the fifth semiconductor regions 402 with the same width W1 are arranged at the same depth, the leakage of the signal charge generated at deep positions of the photoelectric conversion elements can be easily equalized.

Although three fourth semiconductor regions 401 and fifth semiconductor regions 402 are arranged in the present embodiment, the arrangement is not limited to this. Although one third semiconductor region 1012 is arranged, a plurality of third semiconductor regions 1012 may be arranged in the depth direction.

Third Embodiment

Figure 5:
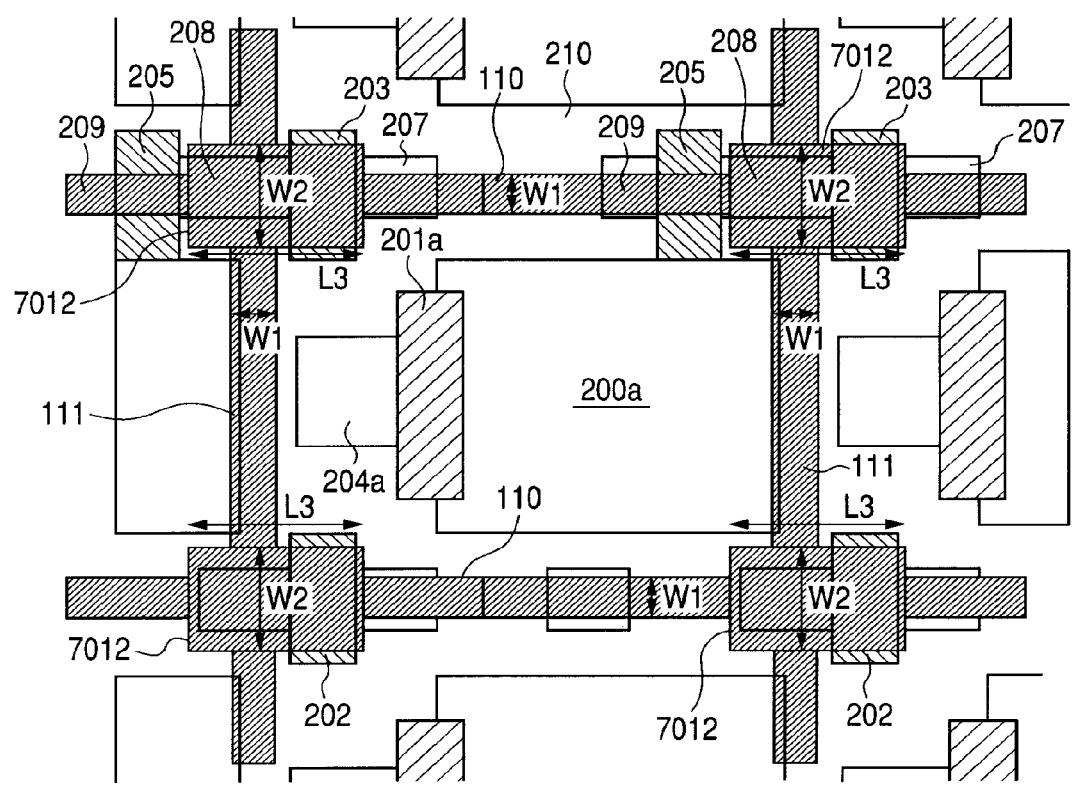
FIG. 5 is a plan view of the photoelectric conversion apparatus according to a third embodiment.

The photoelectric conversion apparatus of the present embodiment will be described with reference to FIG. 5. FIG. 5 is a cross-sectional schematic diagram corresponding to FIG. 1. The same configurations as in FIG. 1 are designated with the same reference numerals, and the description will not be repeated.

Compared to the first embodiment, the photoelectric conversion apparatus of the present embodiment is characterized in that the length of the second semiconductor regions is short. More specifically, second semiconductor regions 7012 have a length L3 in FIG. 5. The length L3 is shorter than the lengths L1 and L2 of the corresponding second semiconductor regions of FIG. 1. The length L3 is longer than the channel length of the transistors. More specifically, the second semiconductor regions 7012 of the present embodiment may not cover some of the source regions and the drain regions as shown in FIG. 5 if at least the channel sections of the transistors are covered. Although the second semiconductor regions have two lengths in the first embodiment, the second semiconductor regions have only one length L3 in the present embodiment. Setting only one length can improve the symmetry of the plane layout and equalize the leakage of the signal charge.

It is desirable that the second semiconductor regions cover the channel sections, because a change in the thresholds of the reset transistors and the amplifying transistors among the plurality of transistors influences the signals to be read out. The second semiconductor regions may not be arranged, and the first or third semiconductor regions may be arranged in the selection transistors, because the influence on the signal is small.

Fourth Embodiment

Figure 6:
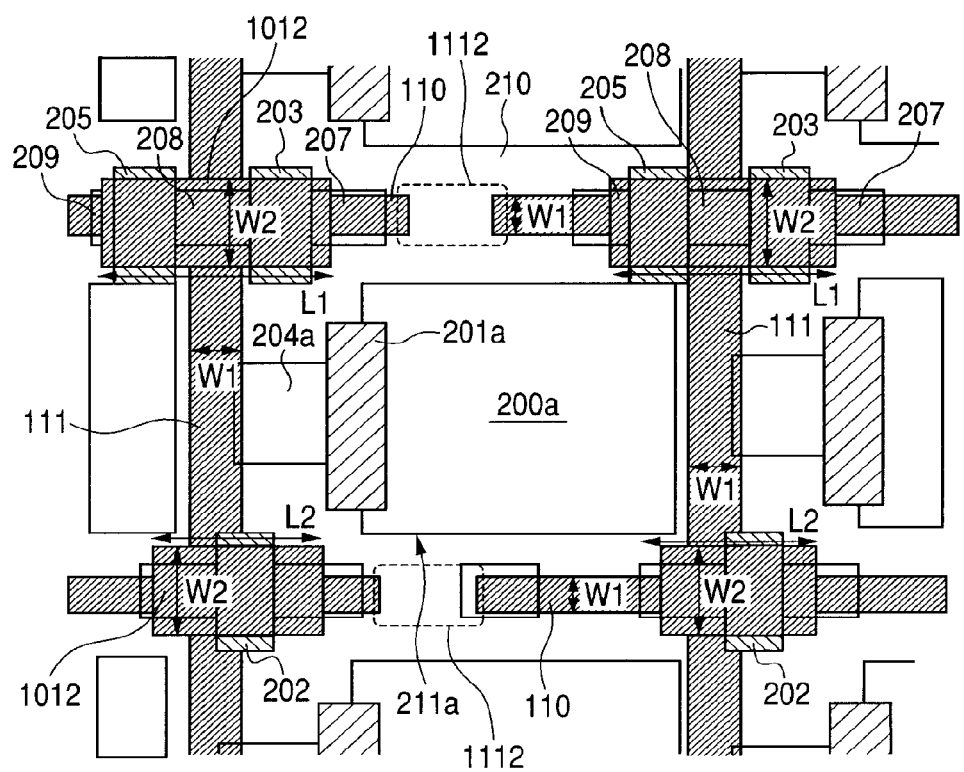
FIG. 6 illustrates the photoelectric conversion apparatus according to a fourth embodiment.

The photoelectric conversion apparatus of the present embodiment will be described with reference to FIG. 6. In FIG. 6, the same configurations as in FIG. 1 are designated with the same reference numerals, and the description will not be repeated.

The photoelectric conversion apparatus of the present embodiment of FIG. 6 includes the first semiconductor regions 110 with the width W1, the third semiconductor regions 111 with the width W1, and the second semiconductor regions 1012 with the width W2. Such a configuration can maintain the characteristics of the photoelectric conversion elements and the transistors while preventing the signal charge from flowing into adjacent photoelectric conversion elements. The photoelectric conversion apparatus of the present embodiment also includes regions 1112 without the semiconductor regions 110 of the first conductivity type. Such a configuration can adjust the signal charge flowing into adjacent photoelectric conversion elements from the photoelectric conversion element 200a. For example, if the signal charge flowing from the photoelectric conversion element 200a into adjacent photoelectric conversion elements in the first direction is smaller than the signal charge flowing from the photoelectric conversion element 200a into adjacent photoelectric conversion elements in the second direction, the amounts of signal charges can be equalized.

The regions 1112 can be arranged below a source region, a drain region, or an arbitrary semiconductor region (such as well contact) supplied with fixed potential such as a power source and a ground. According to such a configuration, dark currents generated by LOCOS, etc. can be discharged to the source region, the drain region, or the semiconductor region. Therefore, the dark currents flowing into the photoelectric conversion elements can be reduced.

Fifth Embodiment

Figure 7:
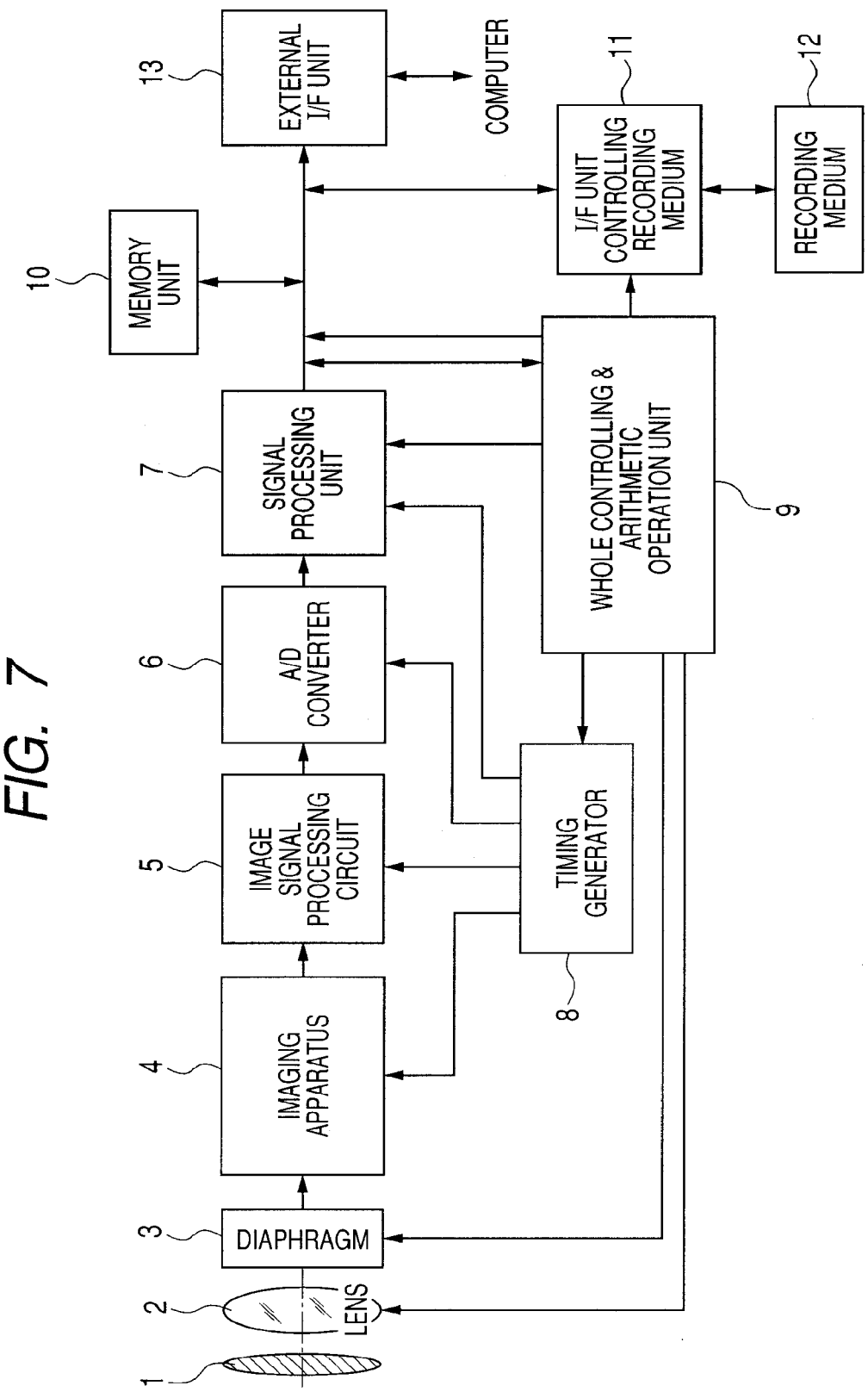
FIG. 7 is a block diagram for describing an imaging system.

An embodiment in which the photoelectric conversion apparatus of the present invention is applied to an imaging system as an imaging apparatus will be described in detail. Examples of the imaging system include a digital still camera, a digital camcorder and a surveillance camera. FIG. 7 illustrates a block diagram in which the photoelectric conversion apparatus is applied to a digital still camera as an example of the imaging system.

In FIG. 7, reference numeral 1 denotes a barrier for protecting a lens. Reference numeral 2 denotes a lens for forming an optical image of a subject on an imaging apparatus 4 (photoelectric conversion apparatus). Reference numeral 3 denotes a diaphragm for changing the amount of light passing through the lens 2. Reference numeral 6 denotes an A/D converter that applies analog-digital conversion of an image signal output by the imaging apparatus 4. Reference numeral 7 denotes a signal processing unit that performs various corrections or that compresses data of image data output by the A/D converter 6. Reference numeral 8 in FIG. 7 denotes a timing generator that outputs various timing signals to the imaging apparatus 4, the imaging signal processing circuit 5, the A/D converter 6, and the signal processing unit 7. Reference numeral 9 denotes a whole controlling & arithmetic operation unit that controls various arithmetic operations and the entire digital still camera. Reference numeral 10 denotes a memory unit that temporarily stores image data. Reference numeral 11 denotes an interface unit that records or reads out data to and from a recording medium. Reference numeral 12 denotes a removable recording medium, such as a semiconductor memory, for recording or reading out image data. Reference numeral 13 denotes an interface unit for communicating with an external computer, etc. The timing signals and other signals may be input from the outside, and the imaging system may include at least the imaging apparatus 4 and the signal processing unit 7 that processes image signals output from the imaging apparatus. The timing generator and the A/D converter may be formed on the same substrate as the imaging apparatus. In this way, the photoelectric conversion apparatus of the present invention can be applied to the imaging system. High-quality images can be acquired by applying the photoelectric conversion apparatus of the present invention to the imaging system.

As described, the configurations of the present invention can provide a photoelectric conversion apparatus capable of preventing reduction in performance of transistors while maintaining the sensitivity of photoelectric conversion elements.

Although the first and third semiconductor regions are arranged in a lattice in the embodiments, the arrangement depends on the elements and is not limited to this. The lengths in the depth direction of the semiconductor regions, such as the first to third semiconductor regions, can also be appropriately set. The configurations and the embodiments can be appropriately combined.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2009-219218, filed Sep. 24, 2009, and No. 2010-185289, filed Aug. 20, 2010 which are hereby incorporated by reference herein in their entirety.

What is claimed is:

1. A photoelectric conversion apparatus comprising:
   a first photoelectric conversion element having a semiconductor region of a first conductivity type capable of accumulating a signal charge;
   a second photoelectric conversion element having a semiconductor region of the first conductivity type, arranged adjacent to the first photoelectric conversion element in a first direction;
   a third photoelectric conversion element having a semiconductor region of the first conductivity type, arranged adjacent to the first photoelectric conversion element in a second direction different from the first direction;
   a plurality of transistors;
   a first semiconductor region of a second conductivity type having a first width, and arranged between the semiconductor region of the first conductivity type of the first photoelectric conversion element and the semiconductor region of the first conductivity type of the second photoelectric conversion element;
   a second semiconductor region of the second conductivity type having a second width, and arranged between the semiconductor region of the first conductivity type of the first photoelectric conversion element and the semiconductor region of the first conductivity type of the third photoelectric conversion element; and
   a third semiconductor region of the second conductivity type having a third width broader than the first and second widths, wherein the plurality of transistors are provided in the third semiconductor region.

2. The photoelectric conversion apparatus according to claim 1, wherein the first direction is perpendicular to the second direction.

3. The photoelectric conversion apparatus according to claim 1, wherein the third semiconductor region contacts the first semiconductor region and the second semiconductor region.

4. The photoelectric conversion apparatus according to claim 1, wherein
   the first semiconductor region has a longitudinal side along a third direction different from the first direction,
   the second semiconductor region has a longitudinal side along a fourth direction different from the second direction, and
   the third semiconductor region is arranged at a position at which the third and fourth directions cross.

5. The photoelectric conversion apparatus according to claim 1, further comprising:
   in a planar view, a rectangular region including the semiconductor region of a first conductivity type of the first photoelectric conversion element,
   wherein the rectangular region is surrounded by the first, second and third semiconductor regions.

6. The photoelectric conversion apparatus according to claim 5, wherein the first and third semiconductor regions are formed along one or more sides of the rectangular region, and the third semiconductor region is positioned at a corner of the rectangular region.

7. The photoelectric conversion apparatus according to claim 1, wherein
   the plurality of transistors include a reset transistor and an amplifying transistor, and
   at least in a channel region of the reset transistor or the amplifying transistor, the third semiconductor region has a width broader than a width of the channel region of the reset transistor or the amplifying transistor, and has a length longer than a length of the channel region of the reset transistor or the amplifying transistor.

8. The photoelectric conversion apparatus according to claim 1, further comprising:
   a region arranged between the semiconductor region of the first conductivity type of the first photoelectric conversion element and the semiconductor region of the first conductivity type of the second photoelectric conversion element,
   wherein the first semiconductor region is not arranged in the region.

9. An imaging system comprising:
   a photoelectric conversion apparatus according to claim 1; and
   a signal processing circuit configured to process a signal outputted from the photoelectric conversion apparatus.

* * * * *